(12) United States Patent
Ishizuka et al.

(10) Patent No.: US 10,348,265 B2
(45) Date of Patent: Jul. 9, 2019

(54) TRANSFORMER-TYPE PHASE SHIFTER, PHASE-SHIFT CIRCUIT, AND COMMUNICATION TERMINAL APPARATUS

(71) Applicant: Murata Manufacturing Co., Ltd., Nagaokakyo-shi, Kyoto-fu (JP)

(72) Inventors: Kenichi Ishizuka, Nagaokakyo (JP); Hiroshi Nishida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/397,763

(22) Filed: Jan. 4, 2017

(65) Prior Publication Data

US 2017/0117868 A1    Apr. 27, 2017

Related U.S. Application Data

(63) Continuation of application No. PCT/JP2016/050183, filed on Jan. 6, 2016.

(30) Foreign Application Priority Data

Jan. 15, 2015   (JP) .................................. 2015-006266
Mar. 9, 2015   (JP) .................................. 2015-045452

(51) Int. Cl.
*H03H 7/18* (2006.01)
*H01F 27/40* (2006.01)
(Continued)

(52) U.S. Cl.
CPC ........... *H03H 7/18* (2013.01); *H01F 27/2804* (2013.01); *H01F 27/40* (2013.01); *H01F 27/42* (2013.01);
(Continued)

(58) Field of Classification Search
CPC ......... H01F 2027/2809; H01F 27/2804; H01F 27/42; H01F 27/40; H01F 19/04;
(Continued)

(56) References Cited

U.S. PATENT DOCUMENTS 7,459,989 B2 * 12/2008 Ezzeddine ............... H03H 7/21
333/132
2002/0024406 A1   2/2002 Matsumoto et al.
(Continued)

FOREIGN PATENT DOCUMENTS

JP           7-38368 A      2/1995
JP       2001-313501 A     11/2001
(Continued)

OTHER PUBLICATIONS

Cheung et al., "Monolithic transformers for silicon RF IC design," Proceedings of the 1998 Bipolar/BiCMOS Circuits and Technology Meeting (Cat. No. 98CH36198), Minneapolis, MN, 1998, pp. 105-108.*

(Continued)

*Primary Examiner* — Michelle M Koeth
(74) *Attorney, Agent, or Firm* — Keating & Bennett, LLP (57) ABSTRACT

A transformer-type phase shifter or a phase-shift circuit includes a first coil and a second coil that is magnetically coupled to the first coil with a coupling coefficient of less than 1, a transformer including a parallel inductance component and a series inductance component, and an impedance adjustment circuit including a reactance element that performs impedance adjustment for the transformer, thus being advantageous in reducing the size, loss, and frequency dependency of the phase-shift amount.

16 Claims, 10 Drawing Sheets

(51) Int. Cl.
*H04B 1/40* (2015.01)
*H01F 27/28* (2006.01)
*H01F 27/42* (2006.01)
*H03H 7/38* (2006.01)
*H03H 7/09* (2006.01)
*H03H 7/19* (2006.01)

(52) U.S. Cl.
CPC ............... *H03H 7/09* (2013.01); *H03H 7/19* (2013.01); *H03H 7/38* (2013.01); *H04B 1/40* (2013.01); *H01F 2027/2809* (2013.01)

(58) Field of Classification Search
CPC ........ H04B 1/0458; H04B 1/40; H03H 11/20; H03H 7/325; H03H 7/18; H03H 7/09; H03H 7/19; H03H 7/38
See application file for complete search history.

(56) References Cited

U.S. PATENT DOCUMENTS

| | | | |
|---|---|---|---|
| 2007/0093219 A1 | 4/2007 | Nakasato et al. | |
| 2010/0198213 A1* | 8/2010 | Lario Garcia | A61B 18/1206 606/33 |
| 2011/0309994 A1* | 12/2011 | Kato | H01P 1/20345 343/860 |
| 2012/0127049 A1 | 5/2012 | Kato | |
| 2013/0335182 A1* | 12/2013 | Zybura | H01F 19/04 336/170 |

FOREIGN PATENT DOCUMENTS

| | | | |
|---|---|---|---|
| JP | 2003-32003 A | | 1/2003 |
| JP | 2003032003 A | * | 1/2003 |
| JP | 2011-244422 A | | 12/2011 |
| WO | 2005/055445 A1 | | 6/2005 |

OTHER PUBLICATIONS

McLyman, C. (2004). Transformer and Inductor Design Handbook, Third Edition. Chapter 17, Boca Raton: CRC Press, pp. 427-439.*
English Machine translation of JP 2003032003(A), Translation generated May 11, 2018, 9 pages.*
Cheung et al., "Monolithic transformers for silicon RF IC design," Proceedings of the 1998 Bipolar/BiCMOS Circuits and Technology Meeting (Cat. No. 98CH36198), Minneapolis, MN, 1998, pp. 105-108. (Year: 1998).*
McLyman, C. (2004). Transformer and Inductor Design Handbook, Third Edition. Chapter 17, Boca Raton: CRC Press, pp. 427-439. (Year: 2004).*
English Machine translation of JP 2003032003(A), Translation generated May 11, 2018, 9 pages. (Year: 2003).*
Official Communication issued in corresponding International Application PCT/JP2016/050183, dated Feb. 9, 2016.

* cited by examiner

FIG. 15

TRANSFORMER-TYPE PHASE SHIFTER, PHASE-SHIFT CIRCUIT, AND COMMUNICATION TERMINAL APPARATUS

CROSS REFERENCE TO RELATED APPLICATIONS

This application claims the benefit of priority to Japanese Patent Application No. 2015-045452 filed on Mar. 9, 2015 and Japanese Patent Application No. 2015-006266 filed on Jan. 15, 2015 and is a Continuation Application of PCT Application No. PCT/JP2016/050183 filed on Jan. 6, 2016. The entire contents of each application are hereby incorporated herein by reference.

BACKGROUND OF THE INVENTION

1. Field of the Invention

The present invention relates to a transformer-type phase shifter connected between an antenna and a feeder circuit, a phase-shift circuit, and a communication terminal apparatus including the transformer-type phase shifter or the phase-shift circuit.

2. Description of the Related Art

For example, a communication terminal apparatus typified by a mobile phone is typically required to have a high-frequency circuit that is small and highly efficient.

In a high-frequency circuit, a phase-shift circuit that rotates a phase angle in order to provide a transmission signal with a predetermined phase to the following-stage (next-stage) circuit is used as a circuit component.

If, for example, a phase-shift circuit and an antenna matching circuit are provided between a high-frequency power amplifier and an antenna in a transmission circuit, and a phase-shift amount of the phase-shift circuit is appropriately set for matching between the power amplifier and the antenna matching circuit, it is possible increase the efficiency of the power amplifier and to suppress the generation of harmonics.

In the related art, for example, a transmission-line-type phase shifter disclosed in Japanese Unexamined Patent Application Publication No. 2003-32003 is advantageous in terms of an insertion-loss characteristic and frequency dependency, but is disadvantageous in terms of a large size if the phase-shift amount is increased. In addition, because of the frequency dependency of the phase-shift amount, the transmission-line-type phase shifter is difficult to apply to a wide-band high-frequency circuit.

On the other hand, a phase-shift circuit including components such as a distributed-constant-type delay line is difficult to apply to a wide-band high-frequency circuit because the frequency dependency of the phase-shift amount is high. Accordingly, it is difficult to use such a phase-shift circuit for mobile phone terminals and the like, which are now using a wider band. In addition, unfortunately, a signal insertion loss will be increased if a large phase-shift amount is obtained.

Figure 15:
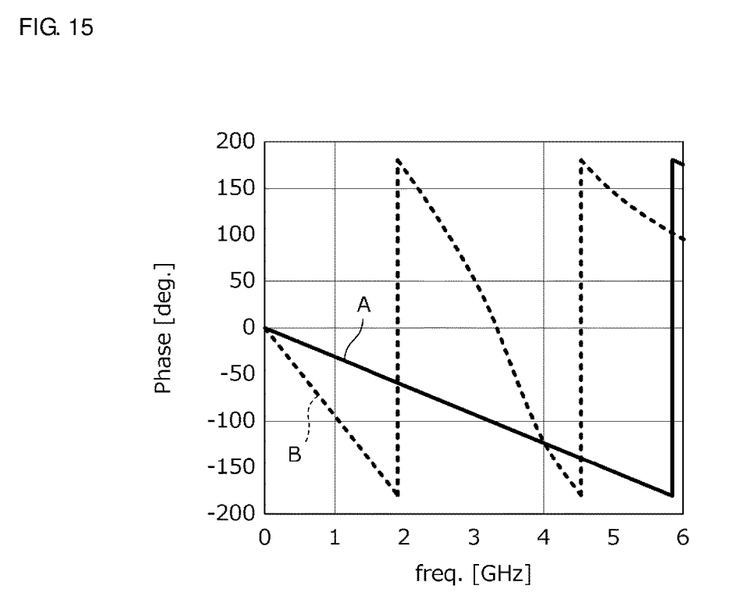
FIG. 15 illustrates a phase-shift characteristic of a transmission line including a phase shifter using a distributed-constant-type delay line of the related art.

FIG. 15 illustrates a phase-shift characteristic of a transmission line including a phase shifter using a distributed-constant-type delay line of the related art. In FIG. 15, the horizontal axis represents the frequency, and the vertical axis represents the phase-shift amount. A characteristic line A represents a characteristic of the transmission line alone, and a characteristic line B represents a characteristic of the transmission line provided with a phase shifter. The difference in phase-shift amount between these lines corresponds to a phase-shift amount of the phase shifter. In this example, phase-shift amounts of the transmission line are −30° at a frequency of 1 GHz and −60° at a frequency of 1.9 GHz, whereas phase-shift amounts of the transmission line connected to the phase shifter are −90° at a frequency of 1 GHz and −180° at a frequency of 1.9 GHz. Therefore, phase-shift amounts of the phase shifter alone are −60° at a frequency of 1 GHz and −120° at a frequency of 1.9 GHz.

In the above manner, both the transmission line and the phase shifter such as the distributed-constant-type delay line have a high dependency on the frequency. That is, the larger the necessary phase-shift amount is, the more difficult it is to apply to wide-band use. In addition, in both the transmission line and the distributed-constant-type delay line, the insertion loss notably increases with an increase in the frequency. In the distributed-constant-type delay line, the increase in the insertion loss at high frequencies is particularly notable. Accordingly, the insertion loss is increased if the phase-shift amount is to be increased.

SUMMARY OF THE INVENTION

Preferred embodiments of the present invention provide a transformer-type phase shifter, a phase-shift circuit, and a communication terminal apparatus including the transformer-type phase shifter or the phase-shift circuit, which are advantageous in reducing the size, loss, and frequency dependency of the phase-shift amount.

A transformer-type phase shifter according to a preferred embodiment of the present invention includes a transformer including a first coil and a second coil that is magnetically coupled to the first coil with a coupling coefficient of less than 1, the transformer including a parallel inductance component and a series inductance component, and an impedance adjustment circuit including a reactance element that provides impedance matching for the transformer.

It is preferable that the impedance adjustment circuit include a first capacitance element connected in parallel to the first coil, a second capacitance element connected in parallel to the second coil, and a third capacitance element connected between the first coil and the second coil. At least one of the first capacitance element, the second capacitance element, and the third capacitance element may be defined by a stray capacitance of the transformer alone or by an actual component.

A transformer-type phase shifter according to a preferred embodiment of the present invention includes a transformer including a first coil and a second coil that is magnetically coupled to the first coil with a coupling coefficient of less than 1, the transformer being connected between a first port and a second port, a first capacitance element connected between the first port connected to the transformer and a ground, a second capacitance element connected between the second port connected to the transformer and the ground, and a third capacitance element connected between the first port and the second port connected to the transformer. At least one of the first capacitance element, the second capacitance element, and the third capacitance element may be defined by a stray capacitance of the transformer alone or may be defined by an actual component.

It is possible to shift a phase exceeding 180°, i.e., exceeding the sum of the phase difference (180°) between an input/output signal of the first coil and an input/output signal of the second coil in the transformer circuit and the phase-shift amount due to the parallel inductance component and the series inductance component in the transformer.

In addition, although the presence of the parallel parasitic inductance component and the series parasitic inductance component in the transformer causes the impedance of the transformer to be different from a predetermined value (e.g., about 50Ω), the reactance element (capacitance elements) enables the impedance to be adjusted.

It is preferable that the transformer be provided in a single stack in which a plurality of base layers are stacked and that the first coil and the second coil be defined by conductor patterns provided on the base layers. Accordingly, it becomes easy to mount a phase shifter as a single component on a communication terminal apparatus or the like because the phase shifter may be mounted on a printed wiring board or the like.

It is preferable that the first coil and the second coil have the same or substantially the same inside diameter, and the same or substantially the same outside diameter and that coil axes thereof have a co-axial relationship. Accordingly, although the first coil and the second coil have a small number of turns, that is, although the first coil and the second coil are small, a transformer with an appropriately high coupling coefficient is able to be obtained.

It is preferable that the third capacitance element mainly include a capacitance between the first coil and the second coil. Accordingly, it is unnecessary to provide a pattern to define the third capacitance element, or the third capacitance element is unnecessary as a component, thus reducing the size and cost.

It is preferable that the first capacitance element be mainly defined by a capacitance between wires of the first coil and that the second capacitance element be mainly defined by a capacitance between wires of the second coil. Accordingly, it is unnecessary to provide patterns to define first capacitance element and the second capacitance element, or the first capacitance element and the second capacitance element are unnecessary as components, thus reducing the size and cost.

It is possible that a transformer ratio between the first coil and the second coil is 1:n (where n is a value other than 1). Accordingly, the transformer is able to shift the phase and also is able to convert the impedance, thus also having the function of an impedance matching circuit between a circuit connected to the first port and a circuit connected to the second port.

A phase-shift circuit according to a preferred embodiment of the present invention includes the transformer-type phase shifter according to any one of the above-described preferred embodiments of the present invention and a phase-shift line that is connected in series to the transformer-type phase shifter with a phase-shift amount of less than about 90°, for example. This configuration enables a predetermined phase shift in a wide range exceeding about 180° in a finely adjusted manner. The phase-shift line may be defined by a substrate and a conductor pattern provided on or in the substrate.

A communication terminal apparatus according to a preferred embodiment of the present invention is a communication terminal apparatus including a feeder circuit and an antenna element that is connected to the feeder circuit, the feeder circuit including a power amplifying circuit, and the communication terminal apparatus includes the transformer-type phase shifter according to any one of the above-described preferred embodiments of the present invention or the phase-shift circuit according to the above-described preferred embodiment of the present invention between the feeder circuit and the antenna element. Accordingly, the efficiency is able to be increased or the size is able to be reduced in a transmission circuit system including an antenna.

According to a transformer-type phase shifter according to a preferred embodiment of the present invention, it is possible to obtain a large phase-shift amount of greater than about 180° in spite of a small size and a small loss. In addition, it is possible to obtain a phase-shift characteristic with a low frequency dependency of the phase-shift amount. In addition, by including the impedance adjustment circuit, it is possible to finely adjust the phase-shift amount.

According to a phase-shift circuit according to a preferred embodiment of the present invention, it is possible to easily obtain a phase-shift amount even greater than 180° while keeping the size small, the loss small, and the frequency dependency of the phase-shift amount low.

According to a communication terminal apparatus according to a preferred embodiment of the present invention, it is possible to increase efficiency and reduce the size in a transmission circuit system including the antenna.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a plurality of preferred embodiments of the present invention will be described by taking some specific examples with reference to drawings. In the drawings, like numerals denote like components. In a second preferred embodiment and the following preferred embodiments, elements or features that are common to those in a first preferred embodiment will be omitted from description, and different elements or features will be described. In particular, like functions and effects obtained by like configurations will not be referred to in each of the preferred embodiments.

First Preferred Embodiment

Figure 1:
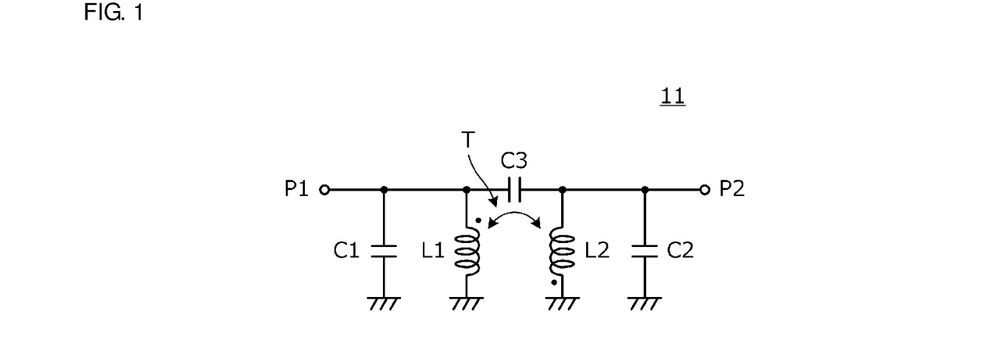
FIG. 1 is a circuit diagram of a transformer-type phase shifter 11 according to a first preferred embodiment of the present invention.

FIG. 1 is a circuit diagram of a transformer-type phase shifter 11 according to a first preferred embodiment of the present invention. The transformer-type phase shifter 11 includes a transformer T. The transformer T includes a first coil L1 and a second coil L2 that is magnetically coupled to the first coil L1 with a coupling coefficient of less than 1. The transformer-type phase shifter 11 further includes an impedance adjustment circuit including a first capacitance element C1, a second capacitance element C2, and a third capacitance element C3.

The first capacitance element C1 is connected in parallel to the first coil L1, and the second capacitance element C2 is connected in parallel to the second coil L2. The third capacitance element C3 is connected between the first coil L1 and the second coil L2.

Figure 2A:
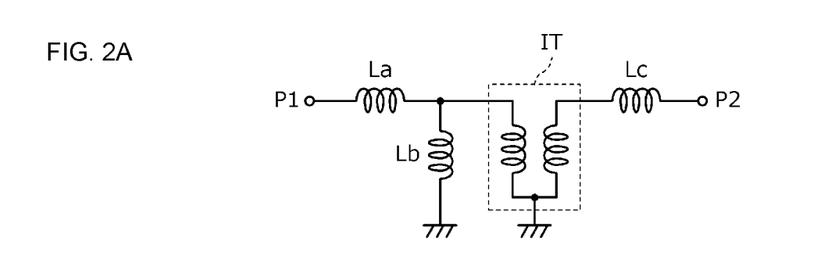
FIGS. 2A and 2B are each an equivalent circuit diagram of a transformer T.
Figure 2B:
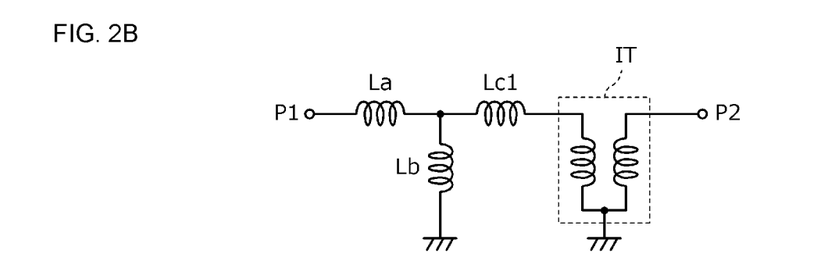

FIGS. 2A and 2B are each an equivalent circuit diagram of the transformer T. The equivalent circuit of the transformer T can be represented in several forms. FIG. 2A illustrates an ideal transformer IT, an inductor La that is connected in series to the upstream side of the ideal transformer IT, an inductor Lb that is connected in parallel to the upstream side of the ideal transformer IT, and an inductor Lc that is connected in series to the downstream side of the ideal transformer IT.

FIG. 2B illustrates the ideal transformer IT, two inductors, the inductor La and an inductor Lc1, which are connected in series to the upstream side of the ideal transformer IT, and the inductor Lb that is connected in parallel to the upstream side of the ideal transformer IT.

Here, if the transformer ratio of the transformer T is denoted by 1:n, the coupling coefficient between the first coil L1 and the second coil L2 (see FIG. 1) is denoted by k, the inductance of the first coil L1 is denoted by L1, and the inductance of the second coil L2 is denoted by L2, the inductances of the inductors La, Lb, and Lc have the following relationship.

La: L1(1−k)

Lb: k*L1

Lc: L2(1−k)

Lc1: $n^2$*L2*(1−k)

The transformer ratio of the ideal transformer corresponds to a transformer ratio according to the number of turns of the first coil L1 and the second coil L2.

In any case, in the transformer T according to this preferred embodiment, since the coupling coefficient k between the first coil L1 and the second coil L2 is less than 1, a series inductance component and a parallel inductance component are generated.

Figure 3:
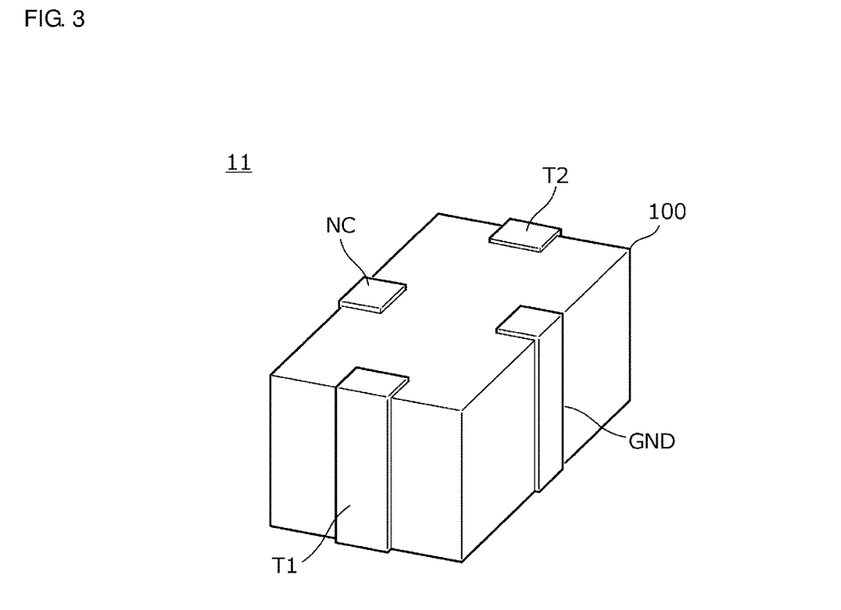
FIG. 3 is an external appearance perspective view of the transformer-type phase shifter 11.
Figure 4:
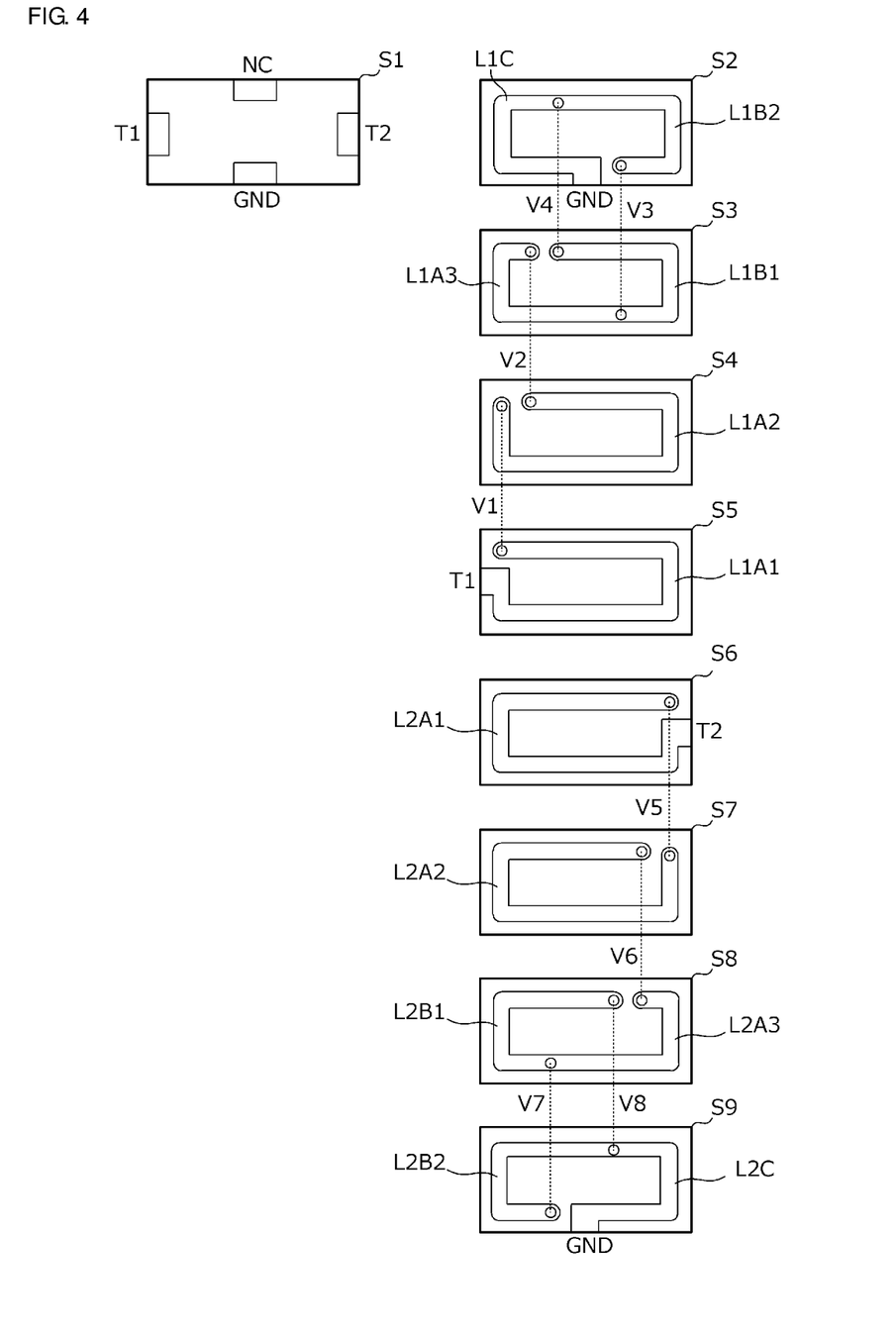
FIG. 4 is a plan view of each layer in the transformer-type phase shifter 11.
Figure 5:
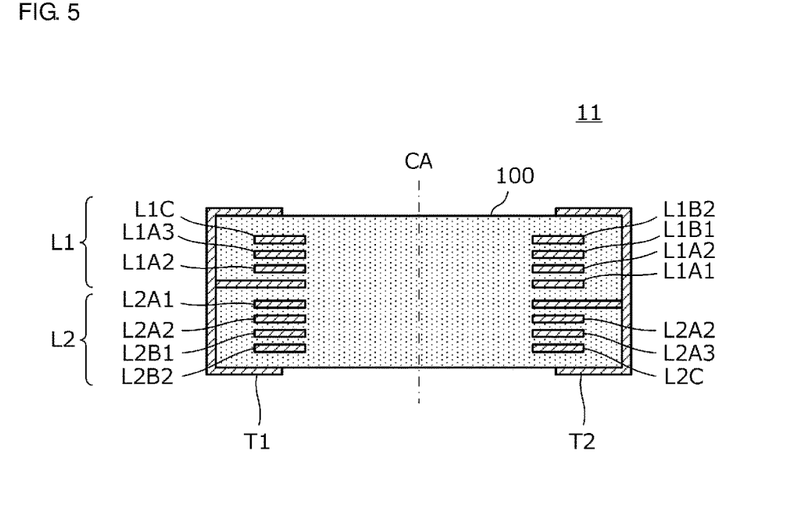
FIG. 5 is a vertical cross-sectional view of the transformer-type phase shifter 11.

FIG. 3 is an external appearance perspective view of the transformer-type phase shifter 11 according to this preferred embodiment, and FIG. 4 is a plan view of each layer in the transformer-type phase shifter 11. FIG. 5 is a cross-sectional view of the transformer-type phase shifter 11. The transformer-type phase shifter 11 includes a plurality of insulating bases S1 to S9. Various conductor patterns are provided on the bases S1 to S9. The phrase "various conductor patterns" refers to, not only a conductor pattern provided on the surface of the base, but also an interlayer connecting conductor. The interlayer connecting conductor includes, not only a via-conductor, but also an end-surface electrode provided on an end surface of a stack 100.

The top surface of the base S1 corresponds to a surface (bottom surface) on which the stack 100 is mounted. On the base S1, a terminal T1 as a first port P1, a terminal T2 as a second port P2, a ground terminal GND, and an open terminal NC are provided.

On the bases S5 and S4, conductors L1A1 and L1A2 are provided, respectively. On the base S3, conductors L1A3 and L1B1 are provided. On the base S2, conductors L1B2 and L1C are provided.

A first end of the conductor L1A1 is connected to the terminal T1 defining and functioning as the first port. A second end of the conductor L1A1 is connected to a first end of the conductor L1A2 via a via-conductor V1. A second end of the conductor L1A2 is connected to a first end of the conductor L1A3 via a via-conductor V2. A second end of the conductor L1A3 is connected to a first end of the conductor L1B1. The second end of the conductor L1A3 and the first end of the L1B1 are connected to a first end of the conductor L1B2 via a via-conductor V3. A second end of the conductor L1B1 is connected to a second end of the conductor L1B2 via a via-conductor V4. The second end of the conductor L1B2 is connected to a first end of the conductor L1C. A second end of the conductor L1C is connected to the ground terminal GND.

Conductors L2A1 and L2A2 are provided on the bases S6 and S7, respectively. Conductors L2A3 and L2B1 are provided on the base S8. Conductors L2B2 and L2C are provided on the base S9.

A first end of the conductor L2A1 is connected to the terminal T2 defining and functioning as the second port. A second end of the conductor L2A1 is connected to a first end of the conductor L2A2 via a via-conductor V5. A second end of the conductor L2A2 is connected to a first end of the conductor L2A3 via a via-conductor V6. A second end of the conductor L2A3 is connected to a first end of the conductor L2B1. The second end of the conductor L2A3 and the first end of the conductor L2B1 are connected to a first end of the conductor L2B2 via a via-conductor V7. A second end of the conductor L2B1 is connected to a second end of the conductor L2B2 via a via-conductor V8. The second end of the conductor L2B2 is connected to a first end of the conductor L2C. A second end of the conductor L2C is connected to the ground terminal GND.

The conductors L1A1, L1A2, L1A3, L1B1, L1B2, and L1C and via-conductors V1, V2, V3, and V4 define the first coil L1. The conductors L2A1, L2A2, L2A3, L2B1, L2B2, and L2C and via-conductors V5, V6, V7, and V8 define the second coil L2. Both of the first coil L1 and the second coil L2 preferably are rectangular or substantially rectangular helical coils, for example.

The base layers in the stack 100 may be a non-magnetic ceramic stack including low-temperature co-fired ceramics (LTCC) or the like or a resin stack including a resin material such as polyimide or a liquid crystal polymer, for example. The base layers are formed of a non-magnetic material (not magnetic ferrite) as described above and thus can be applied to a transformer and a phase shifter having a predetermined inductance and a predetermined coupling coefficient even in a high-frequency band over 700 MHz.

The above-described conductor patterns and interlayer connecting conductors are preferably made of a conductor material including Ag or Cu as a main component and having a low resistivity. If the base layers are ceramics, for example, the conductor patterns and interlayer connecting conductors are preferably formed by screen printing and firing of conductive paste including Ag or Cu as a main component. If the base layers are resin, for example, the conductor patterns and interlayer connecting conductors are preferably patterned by etching a metal foil such as an Al foil or a Cu foil.

The first coil L1 and the second coil L2 preferably have the same or substantially the same inside diameter and the same or substantially the same outside diameter and the same coil winding axis CA (coaxial). Accordingly, although the first coil L1 and the second coil L2 have a small number of turns, that is, although the first coil L1 and the second coil L2 are small, a transformer with an appropriately high coupling coefficient k is obtained. In addition, it is possible to generate a high capacitance between the first coil L1 and the second coil L2, and the third capacitance element C3 having predetermined capacitance is able to be provided.

Figure 6A:
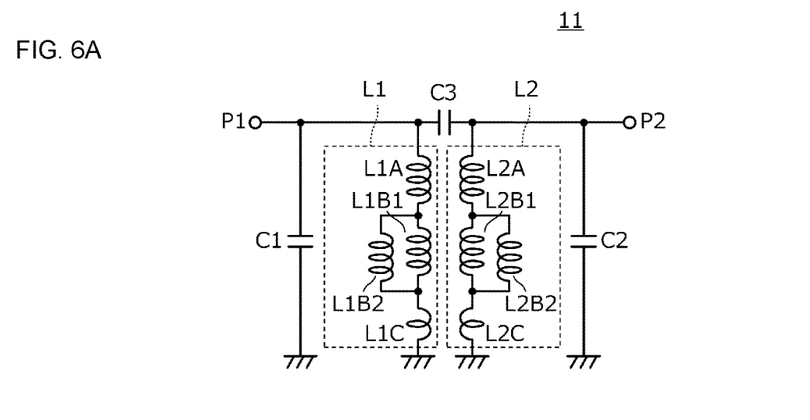
FIG. 6A is a circuit diagram illustrating the transformer-type phase shifter 11.

FIG. 6A is a circuit diagram illustrating the transformer-type phase shifter 11 according to this preferred embodiment. Here, the first coil L1 and the second coil L2 define a transformer.

The first capacitance element C1 is mainly defined by stray capacitance between conductor layers located on the bases S2, S3, S4, and S5. Similarly, the second capacitance element C2 is mainly defined by stray capacitance between conductor layers located on the bases S6, S7, S8, and S9. In addition, the third capacitance element C3 is mainly defined by stray capacitance between the first coil L1 and the second coil L2 and, in particular, is mainly defined by capacitance between the conductor L1A1 and the conductor L2A1.

By reducing the distance between the plurality of conductor layers defining the first coil L1 and the second coil L2, if the capacitance elements C1, C2, and C3 are defined only of stray capacitance, it is possible to increase the self-inductance and the mutual inductance of the first coil L1 and the second coil L2.

Note that at least one of the first capacitance element C1, the second capacitance element C2, and the third capacitance element C3 may be defined by stray capacitance and actual components.

Figure 6B:
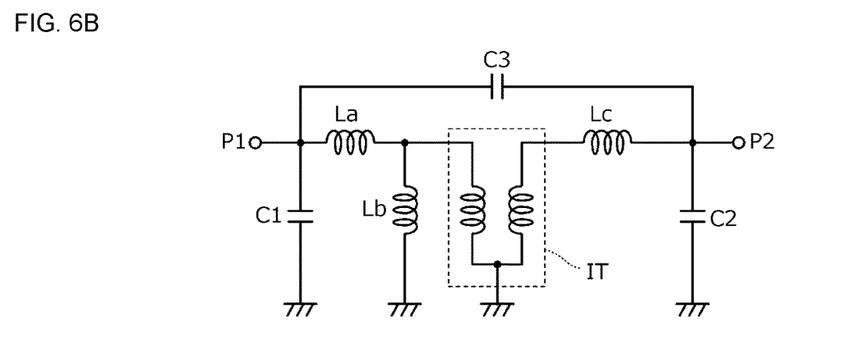
FIG. 6B is an equivalent circuit diagram illustrating the transformer-type phase shifter 11.

FIG. 6B is an equivalent circuit diagram illustrating the transformer-type phase shifter 11 in which the ideal transformer IT and parasitic inductance are separated from each other. The inductors La and Lc denote series parasitic inductance components, and the inductor Lb denotes a parallel parasitic inductance component.

Although the parasitic inductance components (inductors La, Lb, and Lc) cause the inductance of the transformer to be different from a predetermined value (e.g., about 50Ω), by including the capacitance elements C1, C2, and C3, the impedance of the transformer is adjusted to be the predetermined value. In particular, the capacitance elements C1 and C2 have a function of correcting the deviation in the impedance due to the parallel parasitic inductance component Lb, and the capacitance element C3 has a function of correcting the deviation in the impedance due to the series parasitic inductance components La and Lc.

Note that the positions of the via-conductors V3 and V4 illustrated in FIG. 4 determine the ratio of a parallel connection portion of the conductors L1B1 and L1B2 in the first coil L1 illustrated in FIG. 6A. Similarly, the positions of the via-conductors V7 and V8 illustrated in FIG. 4 determine the ratio of a parallel connection portion of the conductors L2B1 and L2B2 in the second coil L2 illustrated in FIG. 6A. Accordingly, the inductance of the first coil L1 is able to be finely adjusted depending on the positions of the via-conductors V3 and V4, and the inductance of the second coil L2 is able to be finely adjusted depending on the positions of the via-conductors V7 and V8.

Current flows in a dispersed manner in the parallel connection portion of the conductors L1B1 and L1B2, whereas current does not disperse in this manner in the conductor L1A1. Similarly, current flows in a dispersed manner in the parallel connection portion of the conductors L2B1 and L2B2, whereas current does not disperse in this manner in the conductor L2A1.

Conductor portions of the first coil L1 and the second coil L2, the portions being close to each other in the stacking direction, contribute the most to the coupling. That is, portions of the conductors L1A1 and L2A1, which face each other in the stacking direction over the entire circumference, contribute to the coupling between the first coil L1 and the second coil L2. As described above, since current does not disperse in the conductors L1A1 and L2A1 due to the parallel connection portion, the coupling strength between the first coil L1 and the second coil L2 is high.

In the above manner, by providing the parallel connection portion apart from the conductor pattern of the other coil in the stacking direction, a decrease in the coupling strength caused by the provision of the parallel connection portion is significantly reduced or prevented.

In addition, by arranging the conductors L1A1 and L2A1, which are connected to the terminals T1 and T2 around the center in the stacking direction, and by arranging the conductors L1C and L2C, which are connected to the ground terminal GND, in the upper portion and the lower portion in the stacking direction, such effects are produced that it is possible to provide a transformer in which the first coil L1 and the second coil L2 share a magnetic flux without a complex configuration and to adjust the capacitance element C3 easily.

Figure 7:
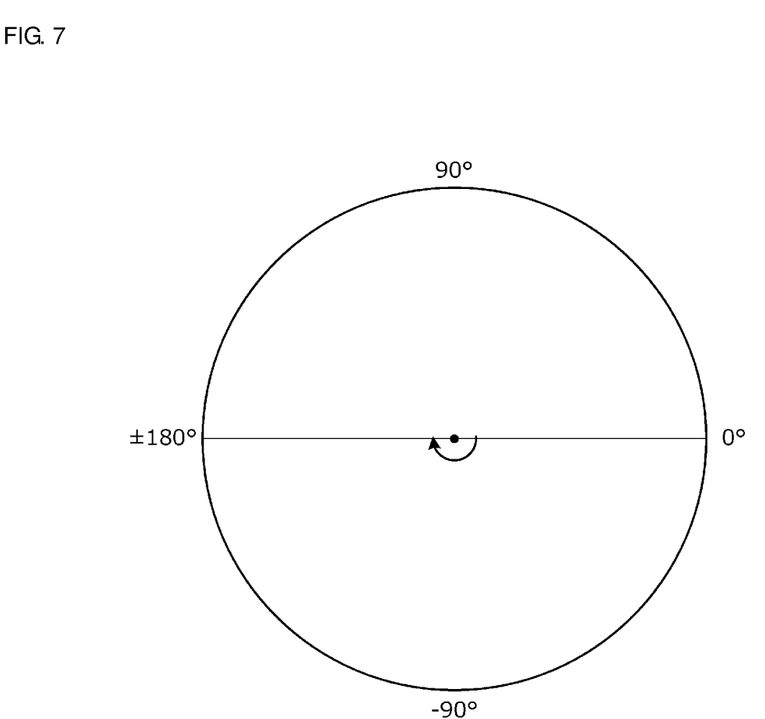
FIG. 7 is a Smith chart illustrating a phase-shift function of the transformer T.

FIG. 7 is a Smith chart illustrating a phase-shift function of the transformer T. If a transformer has a transformer ratio of 1:1 and does not include a parasitic component (if it is an ideal transformer having a transformer ratio of 1:1), both the impedance of the transformer seen from the first port P1 and the impedance of the transformer seen from the second port P2 are plotted at the center of the Smith chart. Note that the phase difference between the port P1 and the port P2 is 180°, as indicated by the semicircle arrow in FIG. 7.

Figure 8:
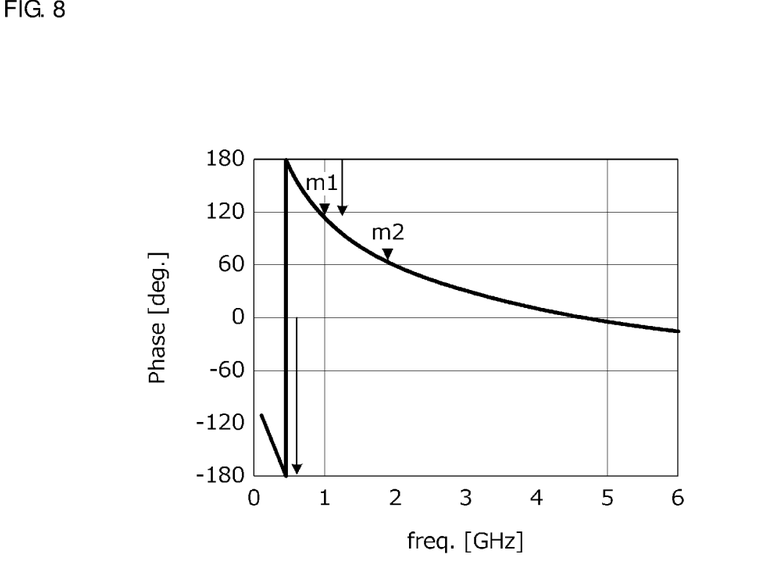
FIG. 8 illustrates a frequency characteristic of a phase-shift amount of the transformer-type phase shifter 11.

FIG. 8 illustrates a frequency characteristic of a phase-shift amount of the transformer-type phase shifter 11 according to this preferred embodiment. In FIG. 8, the horizontal axis represents the frequency, and the vertical axis represents the phase-shift amount. The phase-shift amount is in the range of ±180°. In this example, marker m1 represents a phase-shift amount at a frequency of 1 GHz, and marker m2 represents a phase-shift amount at a frequency of 1.9 GHz. In the representation of FIG. 8, each of the phase-shift amounts is a value obtained by adding 180° to a value obtained by subtracting a read value from 180° on the upper side. That is, the phase-shift amount at 1 GHz is 180°+65°=245°, and the phase-shift amount at 1.9 GHz is 180°+115°=295°.

In this manner, even if the frequency almost doubles, the phase-shift amount becomes only about 1.2 times the original (changed only by about 20%), for example.

Figure 9:
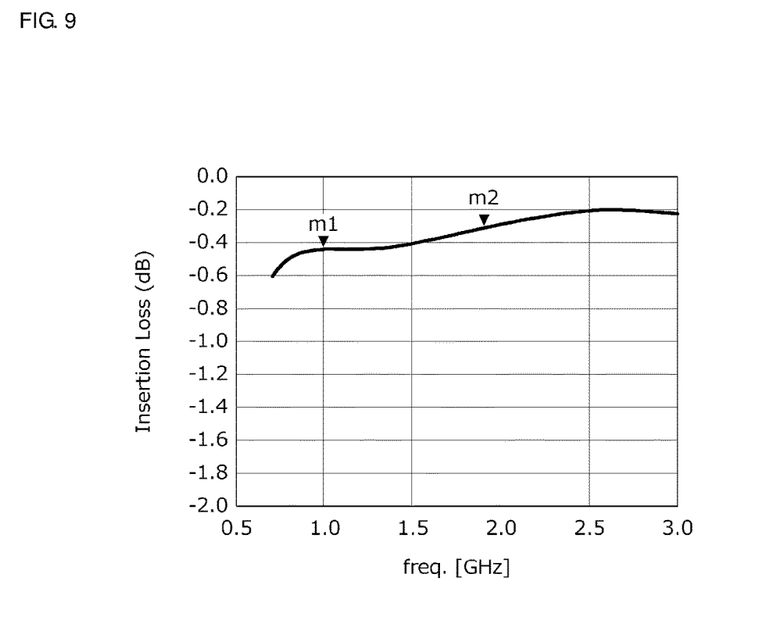
FIG. 9 illustrates a frequency characteristic of an insertion loss of the transformer-type phase shifter 11.

FIG. 9 illustrates a frequency characteristic of an insertion loss of the transformer-type phase shifter 11 according to this preferred embodiment. Insertion losses are about −0.4 dB at a frequency of 1 GHz and about −0.3 dB at a frequency of 1.9 GHz, whereby a low insertion-loss characteristic is obtained. The insertion loss at a frequency of 1.9 GHz is lower than that at a frequency of 1 GHz in this example because more signal components directly pass through the third capacitance element C3 without passing through the transformer T.

Note that the first capacitance element C1 and the second capacitance element C2 are not limited to capacitance between wires of coils, and conductor patterns other than coils may be formed. In addition, a capacitor may be connected as an externally attached component. Furthermore, the third capacitance element C3 is not limited to capacitance between coils, and conductor patterns other than coils may be provided. In addition, a capacitor may be connected as an externally attached component.

Second Preferred Embodiment

Figure 10A:
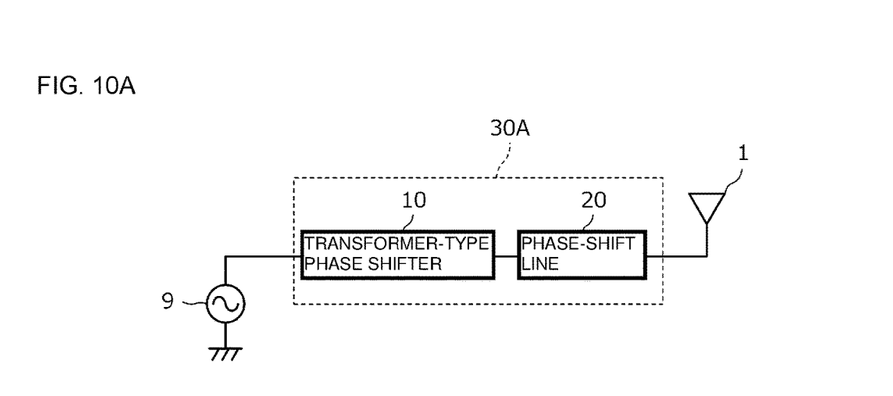
FIGS. 10A and 10B are block diagrams illustrating configurations of phase-shift circuits 30A and 30B according to a second preferred embodiment of the present invention.
Figure 10B:
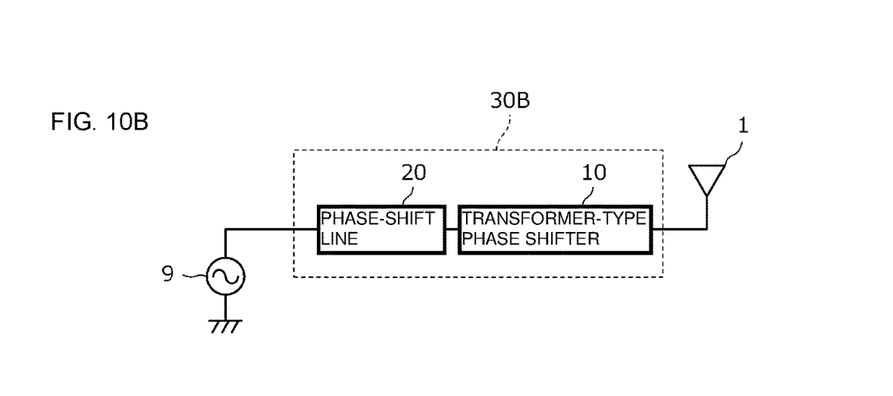

FIGS. 10A and 10B are block diagrams illustrating configurations of phase-shift circuits 30A and 30B according to a second preferred embodiment of the present invention. Each of the phase-shift circuits 30A and 30B is connected between a feeder circuit 9 and an antenna 1. The phase-shift circuit 30A includes a transformer-type phase shifter 10 and a phase-shift line 20 that is connected in series to the transformer-type phase shifter 10. The phase-shift circuit 30B includes the phase-shift line 20 and the transformer-type phase shifter 10 that is connected in series to the phase-shift line 20. The transformer-type phase shifter 10 preferably has the same basic configuration as the transformer-type phase shifter 11 described in the first preferred embodiment. The phase-shift line 20 is a phase-shift line having a phase-shift amount of less than about 90°, for example.

Each of the phase-shift circuits 30A and 30B has a phase difference between ports P1 and P2 by a phase angle obtained by adding the phase-shift amount of the transformer-type phase shifter 10 and the phase-shift amount of the phase-shift line 20.

If the phase-shift amount obtained by fine adjustment of the deviation in the impedance due to the parasitic inductance component of the transformer by adding a capacitance element connected in parallel and a capacitance element connected in series is denoted by α, the phase-shift amount of the transformer-type phase shifter 10 is about 180°+α. If the phase-shift amount of the phase-shift line 20 is represented as β, the phase-shift amount of each of the phase-shift circuits 30A and 30B is about 180°+α+β.

In the above manner, by adding the phase-shift line 20, it is possible to shift the phase even greater than about 180°, thus enabling fine adjustment of the entire phase-shift amount by using the phase-shift amount α of the transformer-type phase shifter 10.

Note that an antenna matching circuit may be provided between each of the phase-shift circuits 30A and 30B and the antenna 1 in FIGS. 10A and 10B.

FIGS. 11A, 11B, 11C, and 11D illustrate circuit configurations of four phase-shift circuits 31, 32, 33, and 34. In FIGS. 11A, 11B, 11C, and 11D, phase-shift lines 21 and 22 and the like are represented as lumped-constant circuits although the phase-shift lines 21 and 22 and the like are distributed-constant circuits. Each of the phase-shift lines includes inductors Ld1 and Ld2 that are connected in series to a transmission line and capacitors Cd1 and Cd2 that are connected in shunt to the ground.

Figure 11A:
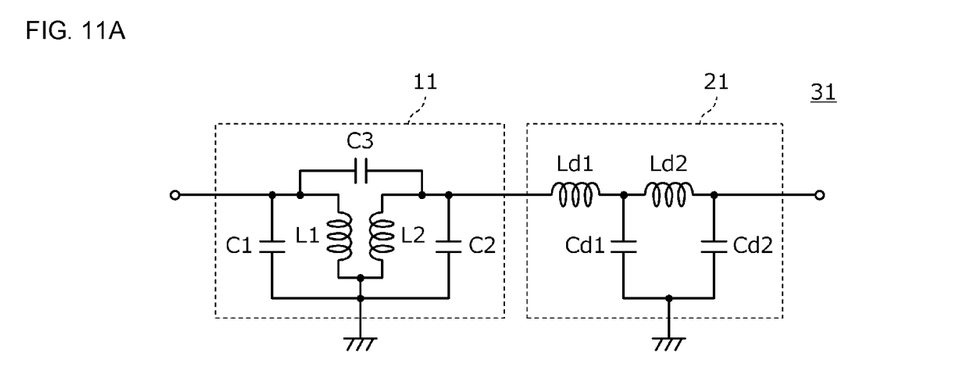
FIGS. 11A, 11B, 11C, and 11D illustrate circuit configurations of four phase-shift circuits 31, 32, 33, and 34 according to the second preferred embodiment of the present invention.

In the example of FIG. 11A, the phase-shift circuit 31 includes the transformer-type phase shifter 11 and the phase-shift line 21. The transformer-type phase shifter 11 is the same as that illustrated in FIG. 1 in the first preferred embodiment.

Figure 11B:
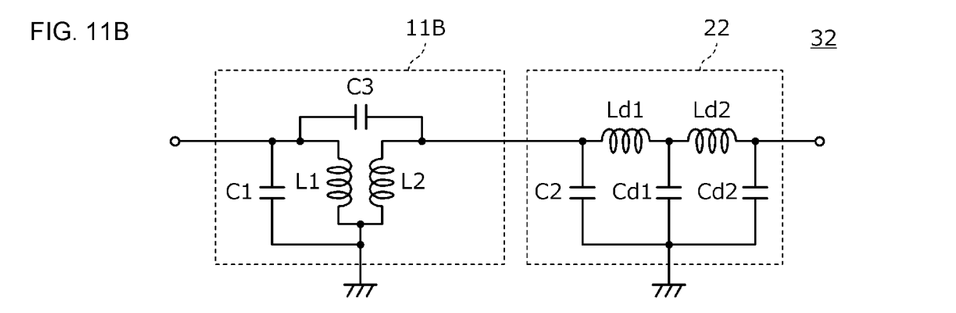

In the example of FIG. 11B, the phase-shift circuit 32 includes a transformer-type phase-shifter main portion 11B and the phase-shift line 22. The capacitance element C2 included in the phase-shift line 22 and the transformer-type phase-shifter main portion 11B define a transformer-type phase shifter.

Figure 11C:
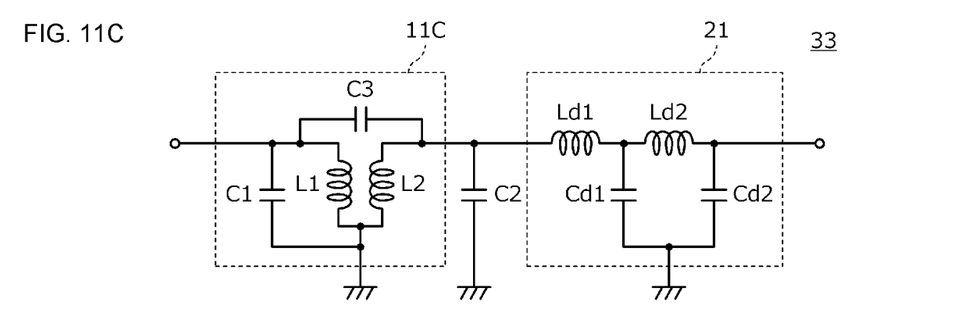

In the example of FIG. 11C, the phase-shift circuit 33 includes a transformer-type phase-shifter main portion 11C, the capacitance element C2, and the phase-shift line 21. The transformer-type phase-shifter main portion 11C and the capacitance element C2, which is an externally attached component, define a transformer-type phase shifter.

Figure 11D:
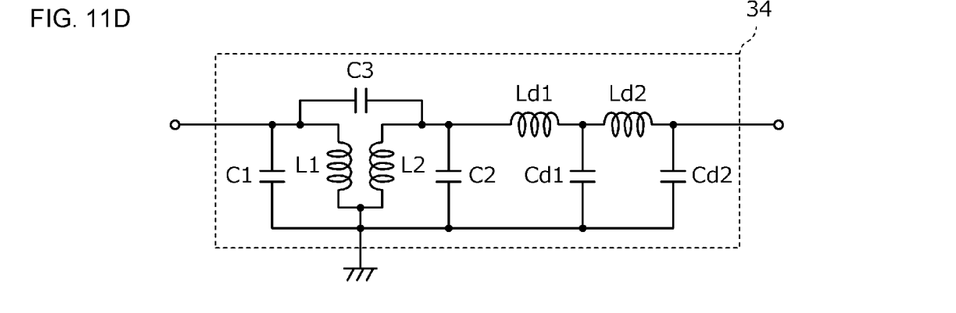

In the example of FIG. 11D, the phase-shift circuit illustrated in FIG. 11A includes a single component.

Note that in the phase-shift line 20, the phase-shift amount may be set by determining the electrical length of the transmission line (for example, an approximately 50Ω line) or may be adjusted by adding a lumped-constant element such as an inductor or a capacitor or an LC circuit.

As described above, although the phase-shift amount of each of the phase-shift circuits 30A and 30B illustrated in FIGS. 10A and 10B is about 180°+α+β, if the transformer included in the transformer-type phase shifter includes many parasitic components (parallel inductance component and series inductance component) (if the coupling coefficient k is small), α can be increased. However, if impedance is to be matched by the impedance adjustment circuit formed of the first capacitance elements C1, C2, and C3 and the like, it is difficult to match the impedance in a wide band (it is difficult to collect impedance loci obtained by a frequency sweep around the center of the Smith chart). Accordingly, if the used frequency band is wide, it is preferable that α be set to a small value and that a predetermined phase-shift amount be obtained by using β instead. Thus, the phase is able to be shifted while keeping the impedance matching. In contrast, if the used frequency band is narrow, α may be set to a large value, and β may be set to a small value instead. Thus, the change in the phase-shift amount depending on the frequency is able to be significantly reduced or prevented. For example, in the case of wide-band application, the coupling coefficient k of the transformer T is preferably in a range of about 0.5≤k<about 1.0; in the case of narrow-band application, the coupling coefficient k of the transformer T is preferably in a range of about 0.3≤k<about 1.0.

Third Preferred Embodiment

Figure 12:
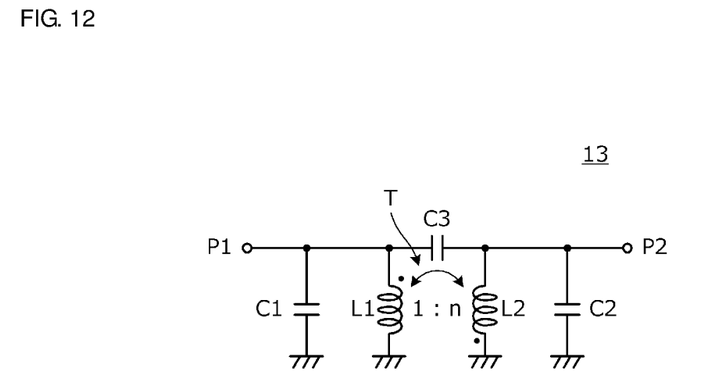
FIG. 12 is a circuit diagram of a transformer-type phase shifter 13 according to a third preferred embodiment of the present invention.

FIG. 12 is a circuit diagram of a transformer-type phase shifter 13 according to a third embodiment of the present invention. Although the first preferred embodiment has described a phase shifter including a transformer with an impedance conversion ratio of 1:1 in the examples illustrated in FIG. 1 and FIGS. 2A and 2B, the impedance conversion ratio may be 1:n (where n is a value other than 1). For example, if n<1 is satisfied, an antenna having impedance lower than the impedance of the feeder circuit is able to be matched with the impedance of the feeder circuit.

Therefore, according to this preferred embodiment, it is possible to perform a predetermined phase shift and impedance matching.

Fourth Preferred Embodiment

Figure 13:
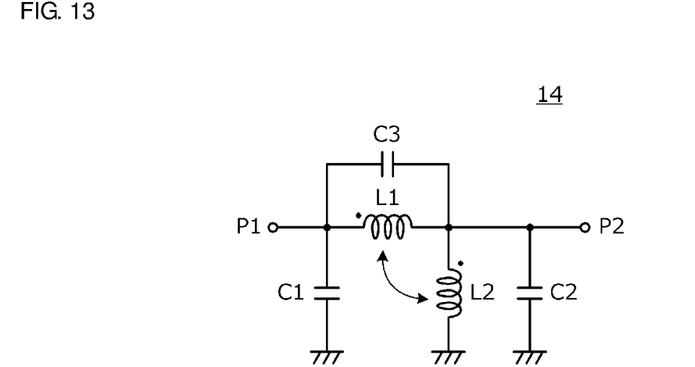
FIG. 13 is a circuit diagram of a transformer-type phase shifter 14 according to a fourth preferred embodiment of the present invention.

FIG. 13 is a circuit diagram of a transformer-type phase shifter 14 according to a fourth preferred embodiment of the present invention. The transformer-type phase shifter 14 according to this preferred embodiment includes an autotransformer including the first coil L1 and the second coil L2 that are magnetically coupled to each other. The first capacitance element C1 is connected between the first port P1 and the ground, and the second capacitance element C2 is connected between the second port P2 and the ground. In addition, the third capacitance element C3 is connected between the first port P1 and the second port P2.

In the autotransformer such as the transformer in this preferred embodiment, since the coupling coefficient between the first coil L1 and the second coil L2 is less than 1, a parallel inductance component and a series inductance component are generated. In addition, the impedance matching is performed by using the capacitance elements C1, C2, and C3.

Fifth Preferred Embodiment

Figure 14:
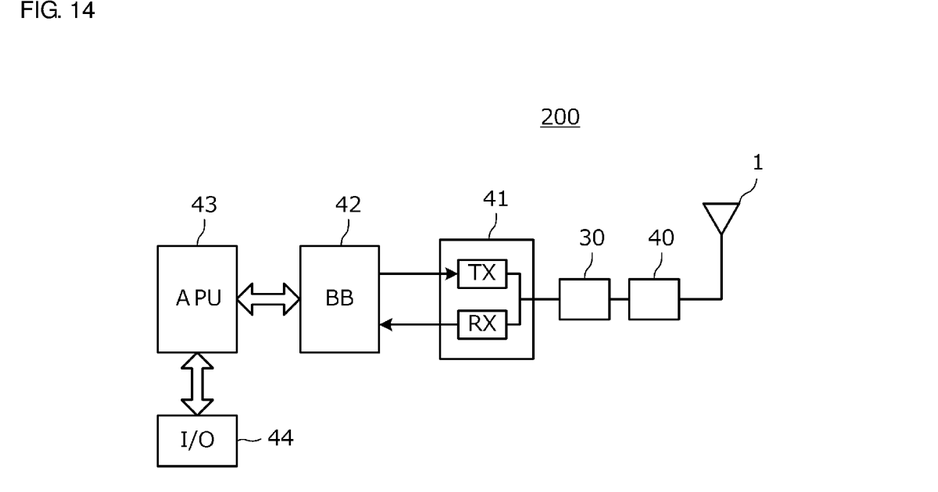
FIG. 14 is a block diagram of a communication terminal apparatus 200 according to a fifth preferred embodiment of the present invention.

A fifth preferred embodiment of the present invention will describe a communication terminal apparatus. FIG. 14 is a block diagram of a communication terminal apparatus 200 according to the fifth preferred embodiment. The communication terminal apparatus 200 according to this preferred embodiment includes the antenna 1, an antenna matching circuit 40, a phase-shift circuit 30, a communication circuit 41, a baseband circuit 42, an application processor 43, and an input/output circuit 44. The communication circuit 41 includes a transmission circuit and a reception circuit for a low band (for example, about 700 MHz to about 1.0 GHz) and a high band (for example, about 1.4 GHz to about 2.7 GHz) and an antenna duplexer. The antenna 1 is a monopole antenna or an inverse F antenna compatible with the low band and the high band.

The above-described components are stored preferably in a single housing. For example, the antenna matching circuit 40, the phase-shift circuit 30, the communication circuit 41, the baseband circuit 42, and the application processor 43 are mounted on a printed wiring board, and the printed wiring board is stored in the housing. The input/output circuit 44 is incorporated in the housing as a display and touch panel. The antenna 1 is mounted on the printed wiring board or arranged on an inner wall of the housing or inside the housing.

The communication terminal apparatus having the above-described configuration and including an antenna that provides matching in a wide band is obtained.

Note that, instead of being inserted in a multi-band communication signal path, the phase-shift circuit 30 may, for example, be used in one of a low-band (for example, about 700 MHz to about 1.0 GHz) line and a high-band (for example, about 1.4 GHz to about 2.7 GHz) line as illustrated in FIG. 14.

Note that the above-described preferred embodiments have illustrated examples in which the impedance adjustment circuit that adjusts the impedance of the transformer preferably includes three capacitance elements C1, C2, and C3. The impedance adjustment circuit is a circuit that corrects or actively modifies the displacement in the impedance due to the parallel inductance component and the series inductance component, which are parasitic components of the transformer. Accordingly, the impedance adjustment circuit does not necessarily include or require three capacitance elements. The impedance of the transformer T may be finely adjusted by connecting the transformer to a predetermined reactance element in parallel or in series.

Lastly, the above-described preferred embodiments are illustrative in all points and are not limiting. A person skilled in the art may make changes or modifications as appropriate. For example, elements or features of the configurations described in different preferred embodiments may be replaced or combined with each other. The scope of the present invention is to be defined by the scope of the claims, not the above-described preferred embodiments. In addition, the scope of the present invention is to include equivalents to the scope of the claims and all changes within the scope of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transformer-type phase shifter comprising:
  a transformer including a first coil and a second coil that is magnetically coupled to the first coil with a coupling coefficient of less than 1, the transformer including a parallel inductance component and a series inductance component; and
  an impedance adjustment circuit including a reactance element that provides impedance matching for the transformer; wherein
  the transformer is provided in a single stack in which a plurality of base layers are stacked;
  the first coil and the second coil are defined by conductor patterns on the base layers;
  the first coil and the second coil have a same or substantially a same inside diameter and a same or substantially a same outside diameter, and coil axes of the first and second coils have a co-axial relationship;
  the conductor patterns of the first coil are provided over a plurality of the base layers that are adjacent, and the conductor patterns of the second coil are provided over another plurality of the base layers that are adjacent and are different from the plurality of the base layers over which the conductor patterns of the first coil are provided;
  the conductor patterns defining the first coil and the second coil on each base layer are each defined by a single turn;
  the conductor patterns of the first coil overlap with each other in a stacking direction in which the plurality of base layers are stacked; and
  the conductor patterns of the second coil overlap with each other in the stacking direction.

2. The transformer-type phase shifter according to claim 1, wherein the impedance adjustment circuit includes:
  a first capacitance element connected in parallel to the first coil;
  a second capacitance element connected in parallel to the second coil; and
  a third capacitance element connected between the first coil and the second coil.

3. The transformer-type phase shifter according to claim 2, wherein the third capacitance element is mainly defined by capacitance between the first coil and the second coil.

4. The transformer-type phase shifter according to claim 2, wherein the first capacitance element is mainly defined by capacitance between the conductor patterns of the first coil in the stacking direction, and the second capacitance element is mainly defined by capacitance between the conductor patterns of the second coil in the stacking direction.

5. The transformer-type phase shifter according to claim 1, wherein a transformer ratio between the first coil and the second coil is 1:n, where n is a value other than 1.

6. The transformer-type phase shifter according to claim 1, wherein
the parallel inductance component and the series inductance component, each of which is a parasitic inductance component, are generated by the coupling coefficient between the first coil and the second coil being less than 1; and
the reactance element corrects a deviation in impedance due to the parallel inductance component and the series inductance component.

7. A transformer-type phase shifter comprising:
a transformer including a first coil and a second coil that is magnetically coupled to the first coil with a coupling coefficient of less than 1, the transformer being connected between a first port and a second port;
a first capacitance element connected between the first port and a ground;
a second capacitance element connected between the second port and the ground; and
a third capacitance element connected between the first port and the second port;
wherein
the transformer is provided in a single stack in which a plurality of base layers are stacked;
the first coil and the second coil are defined by conductor patterns on the base layers;
the first coil and the second coil have a same or substantially a same inside diameter and a same or substantially a same outside diameter, and coil axes of the first and second coils have a co-axial relationship;
the conductor patterns of the first coil are provided over a plurality of the base layers that are adjacent, and the conductor patterns of the second coil are provided over another plurality of the base layers that are adjacent and are different from the plurality of the base layers over which the conductor patterns of the first coil are provided;
the conductor patterns defining the first coil and the second coil on each base layer are each defined by a single turn;
the conductor patterns of the first coil overlap with each other in a stacking direction in which the plurality of base layers are stacked; and
the conductor patterns of the second coil overlap with each other in the stacking direction.

8. The transformer-type phase shifter according to claim 7, wherein the first capacitance element, the second capacitance element and the third capacitance element defines an impedance adjustment circuit including a reactance element that provides impedance matching for the transformer.

9. The transformer-type phase shifter according to claim 7, wherein the third capacitance element is mainly defined by capacitance between the first coil and the second coil.

10. The transformer-type phase shifter according to claim 7, wherein the first capacitance element is mainly defined by capacitance between the conductor patterns of the first coil in the stacking direction, and the second capacitance element is mainly defined by capacitance between the conductor patterns of the second coil in the stacking direction.

11. The transformer-type phase shifter according to claim 7, wherein a transformer ratio between the first coil and the second coil is 1:n, where n is a value other than 1.

12. The transformer-type phase shifter according to claim 7, wherein
a parallel inductance component and a series inductance component, each of which is a parasitic inductance component, are generated by the coupling coefficient between the first coil and the second coil being less than 1; and
the first capacitance element, the second capacitance element, and the third capacitance element correct a deviation in impedance due to the parallel inductance component and the series inductance component.

13. A phase-shift circuit comprising:
the transformer-type phase shifter according to claim 1; and
a phase-shift line that is connected in series to the transformer-type phase shifter with a phase-shift amount of less than about 90°.

14. A phase-shift circuit comprising:
the transformer-type phase shifter according to claim 7; and
a phase-shift line that is connected in series to the transformer-type phase shifter with a phase-shift amount of less than about 90°.

15. A communication terminal apparatus comprising:
a feeder circuit including a power amplifying circuit;
an antenna element that is connected to the feeder circuit; and
the transformer-type phase shifter according to claim 1.

16. A communication terminal apparatus comprising:
a feeder circuit including a power amplifying circuit;
an antenna element that is connected to the feeder circuit; and
the transformer-type phase shifter according to claim 7.

* * * * *

UNITED STATES PATENT AND TRADEMARK OFFICE
CERTIFICATE OF CORRECTION

PATENT NO.         : 10,348,265 B2                         Page 1 of 1
APPLICATION NO.    : 15/397763
DATED              : July 9, 2019
INVENTOR(S)        : Kenichi Ishizuka et al.

It is certified that error appears in the above-identified patent and that said Letters Patent is hereby corrected as shown below:

In the Drawings

Sheet 10, the label --Prior Art-- should be applied to Fig. 15.

Signed and Sealed this
Twenty-first Day of April, 2020

Andrei Iancu
*Director of the United States Patent and Trademark Office*